US006552428B1

(12) United States Patent
Huang et al.

(10) Patent No.: US 6,552,428 B1
(45) Date of Patent: *Apr. 22, 2003

(54) SEMICONDUCTOR PACKAGE HAVING AN EXPOSED HEAT SPREADER

(75) Inventors: Chien Ping Huang, Hsinchu Hsien (TW); Tom Tang, Chang Hwa Hsien (TW); Kevin Chiang, Taichung Hsien (TW); Jenq-Yuan Lai, Taichung (TW); Candy Tien, Taichung Hsien (TW); Vicky Liu, Pingtung (TW)

(73) Assignee: Siliconware Precision Industries Co., Ltd. (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/416,314

(22) Filed: Oct. 12, 1999

(51) Int. Cl.[7] ......................... H01L 23/10; H01L 23/34; H01L 23/28

(52) U.S. Cl. ....................... 257/706; 257/707; 257/712; 257/713; 257/796; 257/787; 257/704

(58) Field of Search ................................ 257/706–707, 257/720, 796, 712–713, 787

(56) References Cited

U.S. PATENT DOCUMENTS 5,397,917 A * 3/1995 Ommen et al. ............. 257/698
5,468,910 A * 11/1995 Knapp et al. .............. 174/52.2
5,656,864 A * 8/1997 Mitsue et al. ............... 257/878
5,907,189 A * 5/1999 Mertol ........................ 257/787
5,977,626 A * 11/1999 Wang et al. ................ 257/707
5,982,621 A * 11/1999 Li .............................. 361/704

* cited by examiner

*Primary Examiner*—Sara Crane
*Assistant Examiner*—Nitin Parekh
(74) *Attorney, Agent, or Firm*—Peter F. Corless; Steven M. Jensen; Edwards & Angell, LLP

(57) ABSTRACT

A semiconductor package with an exposed heat spreader includes a substrate having a semiconductor chip adhered to a first surface of the substrate. The heat spreader includes an upper portion, a lower portion with an opening formed in the center for receiving the semiconductor chip, and a connecting portion for connecting the upper portion and the lower portion in a manner that the upper portion is raised to a height above the opening of the lower portion. The lower portion is formed with a plurality of positioning members outwardly extending from edges of the lower portion to prevent the heat spreader from being dislocated during a molding process, and further includes downward flutes formed on the periphery of the opening for enabling resin flow underneath the heat spreader. The upper portion of the heat spreader is exposed to an exterior of the semiconductor package to improve heat dissipation.

14 Claims, 4 Drawing Sheets

SEMICONDUCTOR PACKAGE HAVING AN EXPOSED HEAT SPREADER

FIELD OF THE INVENTION

The present invention relates to semiconductor packages, and more particularly, to a ball grid array (BGA) semiconductor package having a heat spreader for effectively performing heat dissipation.

DESCRIPTION OF THE PRIOR ART

With rapid advances and unceasing improvements in the electric technology, electronic products such as cellular phone, notebook, and PDA need to be miniaturized in both weight and size without sacrificing functions. To fulfil the tendency for miniaturization of electronic products, the integrated circuit technology adopted to integrate and increase the density of electric circuit and electronic components on a semiconductor chip plays an important role, and so does the IC packaging technology.

Purposes of packaging or encapsulating a semiconductor chip are to protect the semiconductor chip from being affected by outer contaminants such as moisture and dust, to provide an electrical connection between the semiconductor chip and a printed circuit board (PCB), and to provide structural support for preventing the semiconductor chip from being deformed or damaged. A conventional semiconductor package having a leadframe for mounting a semiconductor chip, such as Quad Flat Package (QFP) or Thin Quad Flat Package (TQFP) has a limitation to increase the number of the I/O pins and to decrease the pitch between any two adjacent I/O pins. As a result, Ball Grid Array (BGA) type semiconductor packages are developed to solve the problems existing in conventional leadframe type semiconductor packages. The BGA semiconductor package typically has an array of solder balls attached to the substrate for bearing a semiconductor chip. As the solder balls are allowed to be disposed under the semiconductor chip, the BGA semiconductor package has an optimized pin count.

For the BGA semiconductor package, heat generated from a semiconductor chip in operation is dissipated to the outside of the package via the route comprised of the semiconductor chip, silver paste, conductive traces on a top surface of a substrate, the substrate, conductive traces on a bottom surface of the substrate, and solder balls. However, the thermal conductive path for a BGA semiconductor package is so long that the heat generated by the semiconductor chip can not be effectively and efficiently dissipated out of the package body via the aforementioned heat dissipating path, while the density of semiconductor components and electric circuit on the semiconductor chip is considerably increased. Thus, a BGA semiconductor package having a heat spreader for improving thermal conductivity has been disclosed in U.S. Pat. No. 5,736,785. As shown in FIGS. 10 and 11, the semiconductor package of U.S. Pat. No. 5,736,785 has a heat spreader 116, which sits on the top surface of the substrate 104 to which the die 102 is adhered, for effectively dissipating heat. There are first supporters **116*f* at corners of the square-shaped heat spreader 116 for preventing the die 102 from being moved and damaged while the heat spreader 116 is disposed in the package body 112. A shallow dish-like recessed portion 116*a* protrudes from the central portion of bottom surface of the heat spreader 116 to contact a top surface of the die 102 for effectively dissipating heat generated by the die 102 to the outside of a package body through the heat spreader 116. Meanwhile, four hemispherical downward projections 116*c* are provided on corners of the heat spreader 116. And the downset of the hemispherical downward projections 116*c* is adapted to be deeper than that of the shallow disk-like recessed portion 116*a* so that when mounted on the top surface of the substrate 104, the heat spreader 116 is supported by the hemispherical downward projections 116*c* without causing pressure to the die 102. There are four openings 116*b* formed on the heat spreader 116 for allowing the packaging resin to flow into space under the heat spreader 116** during molding process.

Such semiconductor package can effectively increase the efficiency of heat dissipation by making the heat spreader 116 in contact with the die 102. However, for packaging the die 12 and the heat spreader 116 with packaging resin, the packaging process needs to take extra steps to adhere the bottom surface of the shallow disk-like recessed portion **116*a* of the heat spreader 116 to the die 102, when compared with conventional packaging operation for BGA semiconductor packages. The packaging process for such semiconductor package comprises the following steps of; (a) attaching the die 102 to the top surface of the substrate 104, and making electrical connection from the die 102 to the substrate 104 by gold wires 108; (b) preparing a fixture for the substrate 104 to allow the die 102 to be received in an opening of the fixture; (c) daubing the die 102, a portion o fate substrate 104, and gold wires 108 with epoxy resin through the opening of the fixture; (d) setting the heat spreader 116 on the top surface of the chip 102 via the opening of the fixture, and adjusting a location of the heat spreader 116 by using the fixture to downwardly press the heat spreader 116 for letting the top surface of the heavy spreader 116 to be covered with the epoxy resin, and to attach the heat spreader 116 to the top surface of the chip 102** via the epoxy resin; (e) removing the fixture, and curing the epoxy resin; and (f) proceeding the molding process.

However, the aforementioned process, which takes time longer than conventional processes, has drawbacks as follows: (a) A fixture is needed to adjust the location of the heat spreader on the top surface of the chip 102 prior to adhering the heat spreader 116 to the chip 102. However, there is required a permissible gap between the edge of the heat spreader 116 and the fixture to allow the heat spreader 116 be clipped and adopted inside the fixture, so that the location of the heat spreader 116, corresponding to the chip 102, is not precisely set over the semiconductor chip 102, and then, an off-center phenomena resulted from the misalignment between the heat spreader 116 and the chip 102 would affect the outlook of the semiconductor package. (b) Compared with conventional process, although each step, from aforesaid step (b) to (e), of the molding process of U.S. Pat. No. 5,736,785 can be accomplished in the same work area, however, extra steps which are step (b) to step (c) are still needed for the molding process, and thus, the molding process is more complicated than convention one and the production cost would increase. (c) Due to different expansion coefficient of the heat spreader 116 and the chip 102, after the heat spreader 116 has been adhered to the top surface of the chip 102 and the molding process has been accomplished, a de-lamination phenomena resulted from a interface between the heat spreader 116 and the chip 102 would degrade qualities of products. (d) In addition, the heat spreader 116 should be adhered to the chip 102 and the chip 102 is sensitive to pressures inside the encapsulant so that when the upper and lower mold half are combined together for introducing the epoxy resin into cavities of the two mold halves, the pressure resulted from the resin flow inside cavities will exert to the chip 102 via the heat spreader 116, causing the chip 102 to be cracked; meanwhile, a thermal stress caused by high temperature effect during the molding process is still remained inside the heat spreader 116, and that would crack the chip 102, while the resin is cured. (e) Further, there are a dish-like recessed portion 116*a* of the central region of the heat spreader 116, and four hemispherical downward projections 116*c* on four corners, so that during the molding process, the epoxy resin which flows into a cavity between the upper mold half and the chip 102 would be retarded by the dish-like recessed portion 116*a* and the hemispherical downward projections 116*c*, and then, a turbulent resin flow phenomena immerges. Therefore, voids are formed inside the cured epoxy of the encapsulant, and degrade qualities of finished products.

SUMMARY OF THE INVENTION

Accordingly, an object of the present invention is to provide a semiconductor package having an exposed heat spreader on a top surface of a substrate, in which the placement of the heat spreader can be easily carried out without adjustment operation.

Another purpose of the present invention is to provide a semiconductor package having an exposed heat spreader, which can improve heat dissipation.

Still another object of the present invention is to provide a semiconductor package having an exposed heat spreader which is simple in assembly and low in production cost.

A further object of the present invention is to provide a semiconductor package having an exposed heat spreader which can increase the yield of the products.

Still a further object of the present invention is to provide a semiconductor package having an exposed heat spreader for decreasing voids inside the cured resin according to steady resin flow during the molding process.

To achieve above and other objects of the present invention, a semiconductor package, comprising a substrate having a first surface and a second surface; first conductive traces formed on the said first surface of the substrate; second conductive traces formed on the second surface of the substrate and electrically connected with the first conductive trace via a plurality of vias formed in the substrate; a semiconductor chip mounted on the first surface of the substrate and being electrically connected to the first conductive trace; a plurality of solder balls attached to the second surface of the substrate for electrical connection with the second conductive traces, a heat spreader disposed on the first surface of the substrate the heat spreader comprising a lower portion formed with an opening in the center for receiving the semiconductor chip portion, and a connecting portion for connecting the lower portion and the upper portion in a manner that the upper portion is raised to a height above the opening of the lower portion, wherein the lower portion is formed with a plurality of positioning members outwardly extending from edges of the lower portion for preventing the heat spreader on the substrate from being dislocated during molding process and, a plurality of supporting members to support the heat spreader over the substrate to allow a top surface of the upper portion to be exposed to the exterior of an encapsulant subsequently formed to encapsulate the semiconductor chip and a portion of the heat spreader, and to keep the semiconductor chip form being in contact with the heat spreader.

The predetermined distance between the lower portion of the heat spreader and the substrate is defined as the downset of the supporters, and large enough for making the top surface of the upper portion of the heat spreader be exposed to the outside of the cured encapsulant, and contact with the air, after the molding process.

The supporters are uniformly punched and formed on the lower portion. Each supporter has an indented portion which can be a dish-like recessed portion, a cone-shaped portion, or a hemispherical downward projection, or a vertical sectional view of supporters is V-shaped or U-shaped, without restrictions. The supporter also can be downward tongue-shaped by uniformly cutting the lower portion.

A top surface of the upper portion of the heat spreader is a plane-like shape, but, however, it can also be a wave-like shape, a square-wave-like shape, or a plurality of short cylinders extend from the top surface for increasing a surface area of the top surface to effectively dissipate heat during operation.

Besides, contacting portions are formed on each side, each corner, or two opposite sides, of the heat spreader.

After the molding process, the top surface of the upper portion of the heat spreader is allowed to be exposed to the outside of the encapsulant, without flash thereon by having the height of the heat spreader greater than that of a cavity of an encapsulating mold consisting of an upper mold half and a lower mold half. Therefore, while the upper and lower mold halves are combined together, the inner surface of the upper mold half would tightly contact with the upper portion of the heat spreader to slightly press the heat spreader, during the molding process. Due to the slight deformation of the heat spreader, which is caused by the downward pressure from the upper mold half to the heat spreader, the top surface of the upper portion of the heat spreader closely contacts with the inner surface of the upper mold half. Thus, the flash phenomena would not happen. Meanwhile, the difference between those two vertical distances is less than 0.2 mm, but is preferred to be less than 0.1 mm.

BRIEF DESCRIPTION OF THE DRAWINGS

The above and other objects, features and other advantage of the present invention will be more clearly understood from the following detailed description taken in conjunction with the accompanying drawings, in which.

DETAILED DESCRIPTION OF THE PREFERRED EMBODIMENT

Figure 1:
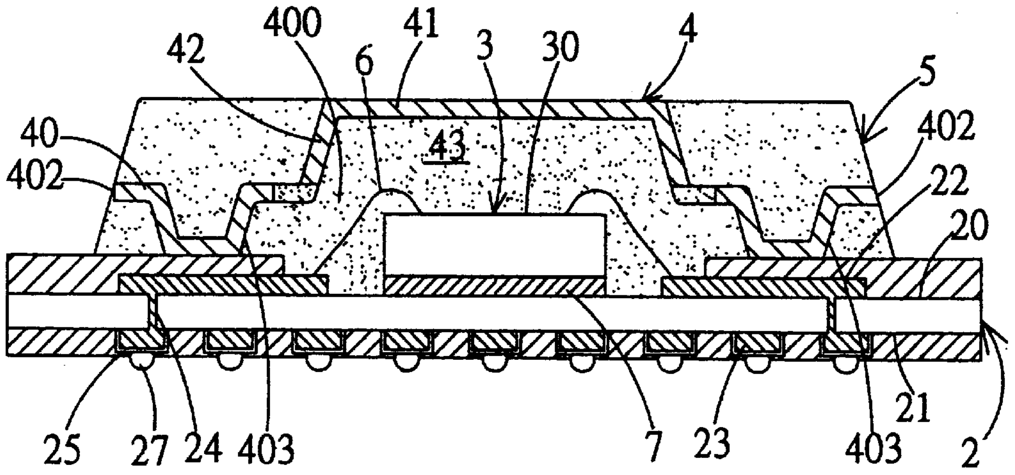
FIG. 1 is a sectional view which illustrates the construction of a semiconductor package having exposed heat spreader in accordance with the first embodiment of the present invention.
Figure 2:
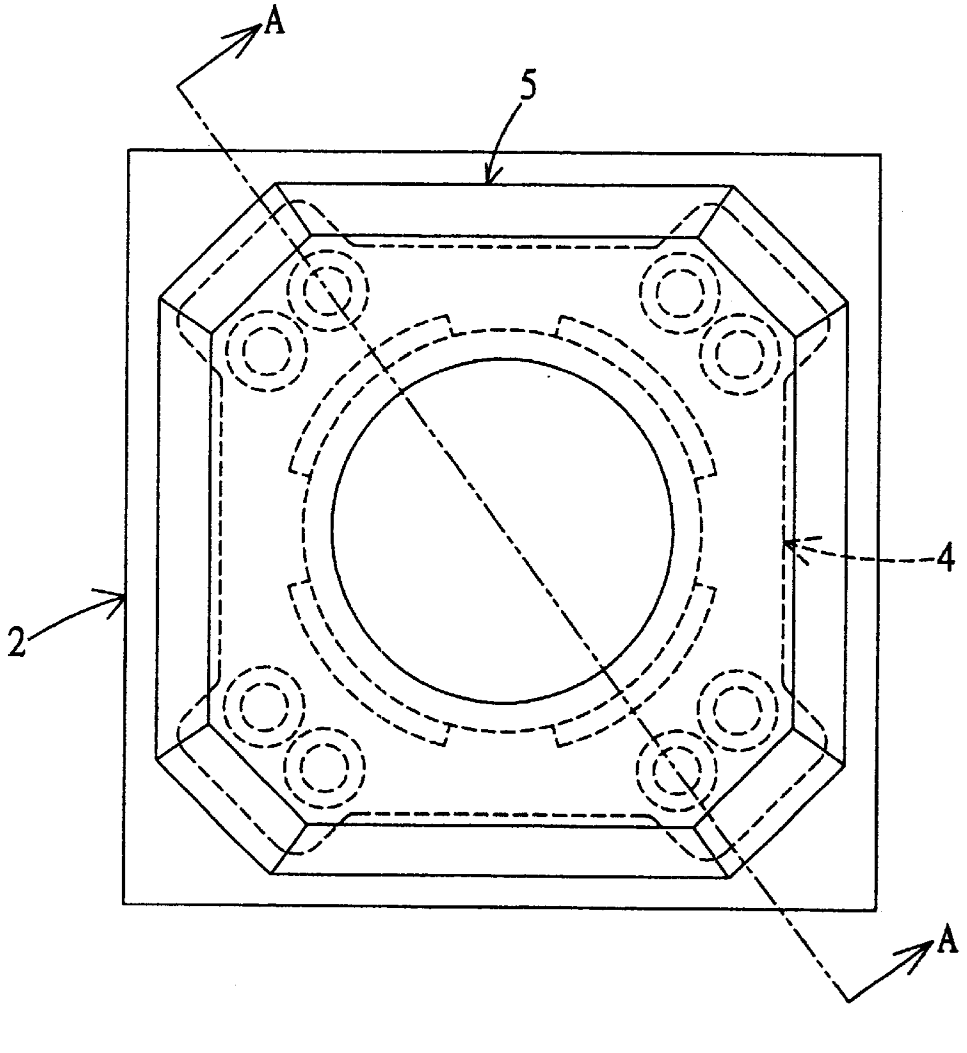
FIG. 2 is an overlooked view which illustrates the semiconductor package having exposed heat spreader in accordance with the first embodiment of the present invention.
Figure 3:
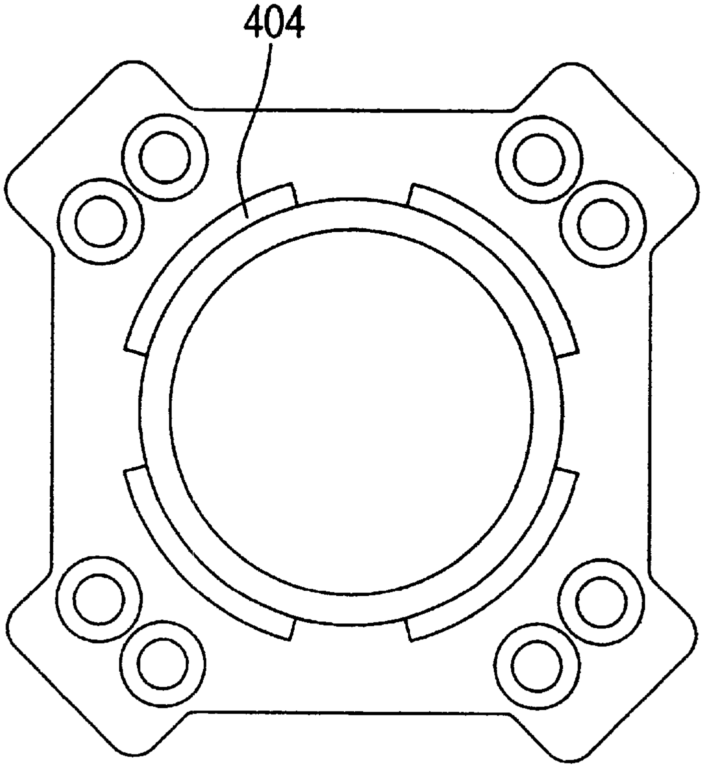
FIG. 3 is an overlooked view which illustrates a heat spreader of the semiconductor package in accordance with the first embodiment of the present invention.

Referring to FIGS. 1, 2 and 3, the semiconductor package of the first embodiment of the present invention includes a substrate 2 having first surface 20 and a second surface 21, a chip 3 which is adhered to the receiving area of the substrate 2, a heat spreader 4 sitting on the substrate 2, and an encapsulant 5 for encapsulating the chip 3.

The first conductive traces 22 on the first surface 20 is electrically coupled to the second conductive traces 23 on the second surface 21 by a plurality of vias 24 of the substrate 2. Meanwhile, the bond pads 25 on ends of the second conductive traces 23 with solder balls 27 adhered to it provide paths for the chip 3 to electrically connect with ends outside the encapsulant 5. Besides, gold wires 6 bonded on the top surface 30 of the chip 3 make electrical connection from the first conductive traces 22 to the chip 3.

The heat spreader 4 includes a lower portion 40 with an opening 400 inside it, an upper portion 41, and a connecting parts 42 for connecting the periphery of the opening 400 and edges of the upper portion 41. Positioning members 402 are formed on both sides of each of extending parts 401 which are formed at each corresponding corner of the lower square-shaped sheet. Two supporting parts 403 with a V-shaped vertical section and a round cross section are uniformly formed between the opening 400 of the lower portion 40 and the corresponding extending parts 401 to make the lower portion 40 of the heat spreader 4 keep a predetermined distance from the first surface 20 of the substrate 2 for exposing the top surface 410 of the upper portion 41 to the outside of the encapsulant 5, while the heat spreader 4 is sat on the first surface 20 of the substrates 2. Meanwhile, downward flutes 404 are cut and formed in locations of the periphery of the opening 400 corresponding to the extending parts 401 for making the package resin flow into the underneath of the heat spreader 4 through grooves 404. Connecting parts 42 connect the upper portion 41 and the lower portion 40 to form the containing space 43 for containing the chip 3, and making the chip 3 and gold wires 6 untouched with the heat spreader 4

Figure 4:
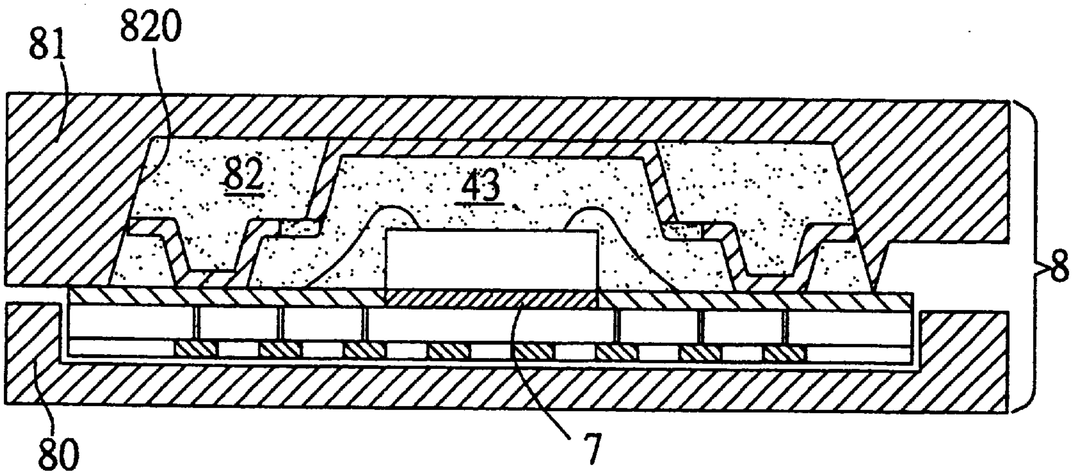
FIG. 4 is a sectional view which illustrates a semiconductor package having exposed heat spreader shown in FIG. 1 inside the molds during the molding process.

Now referring to FIG. 4, the substrate 2 with the chip 3 adhered to it by the silver paste is located on the inner top surface of the lower half mold 80 of the packaging molds 8, and then, the heat spreader 4 is sat over the substrate 2 (inside the cavity 82 of the upper mold half 81), and thereafter, the substrate 2 and the heat spreader 4 are sandwiched between the pair of encapsulating molds, upper mold half 81 and lower mold half 80. Meanwhile, due to positioning members 402 being against side-walls 820 of the upper mold half 81, the heat spreader 4 sat on the substrate 2 is fixed, and not needed to adjust its location.

As shown in FIG. 1, however, the top surface 410 of the upper portion 41 of the heat spreader 4 according to the present invention is exposed to the outside of the encapsulant 5, so that the heat dissipation effect is increased by the increased heat dissipation area, top surface of the upper portion of the heat spreader, directly exposed to the outside of the encapsulant 5, and, moreover, due to the reason that heat spreader 4 is not adhered to the substrate 2, the location of the heat spreader 4 is not needed to be adjusted, and the encapsulating process is simplified.

Meanwhile, the cavity-down molding process can also be used in the pair of the encapsulating molds 8 of the present invention, by using the drop-in way to make the heat spreader 4 against the inner side-walls of the lower mold half, and then, to put the substrate 2 with the chip 3 toward the lower mold half, and thereafter, to proceed the molding process.

Figure 5:
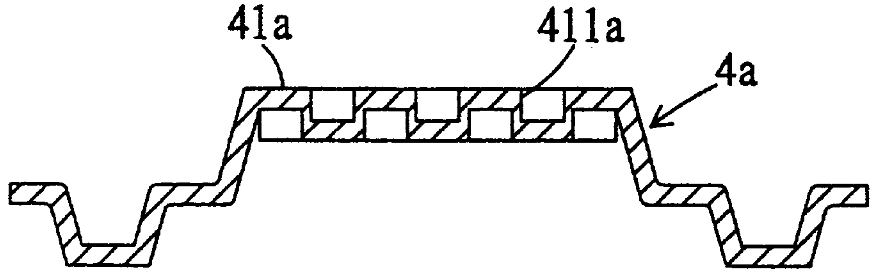
FIG. 5 is a sectional view which illustrates the heat spreader of the semiconductor package in accordance with the second embodiment of the present invention.

In FIG. 5, the structure of the encapsulant according with the second embodiment of the present invention is generally like that of the aforesaid first embodiment. However, the upper portion 41*a* of the heat spreader 4*a* in the second embodiment has rectangular-wave-shaped parts 411*a* to increase the surface area of the upper portion 41*a* for further effectively performing heat dissipation.

Figure 6:
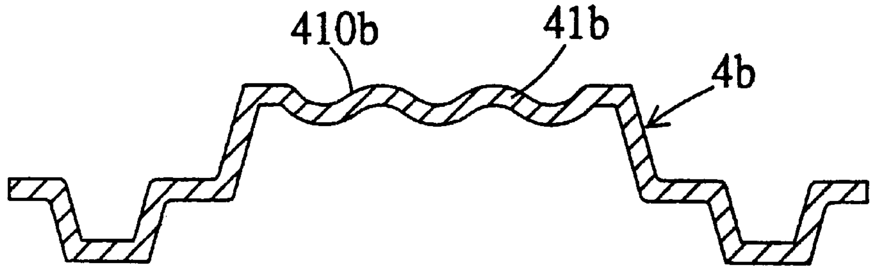
FIG. 6 is a sectional view which illustrates a heat spreader of a semiconductor package in accordance with the third embodiment of the present invention.

Shown in FIG. 6, the third embodiment of the present invention has the structure which is similar to that of the first embodiment. However, the upper portion 41*b* of the heat spreader 4*b* in the third embodiment has wave-shaped parts 410*b* to increase the surface area of the upper portion 41*b* for further effectively performing heat dissipation.

Figure 7:
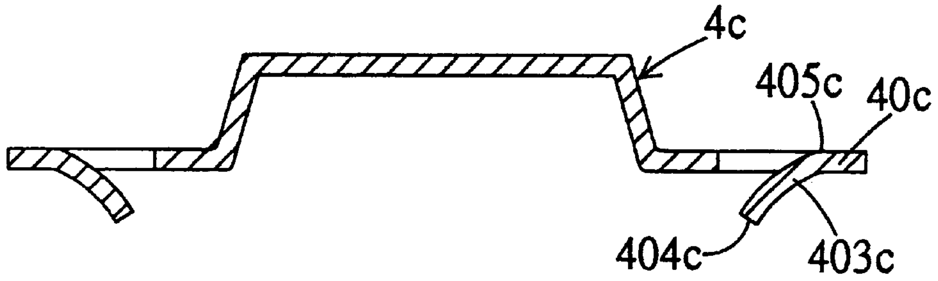
FIG. 7 is a sectional view which illustrates a heat spreader of a semiconductor package in accordance with the fourth embodiment of the present invention.

Referring to FIG. 7, the fourth embodiment of the present invention has the structure which is also similar to that of the first embodiment. However, downward tongue 403*c* is uniformly formed by cutting the lower portion 40*c* of the heat spreader 4*c*. the downward tongue 403*c* extends from the ends 405*c* of the lower portion 40*c* to touch with the first surface 20 of the substrate 2.

Figure 8:
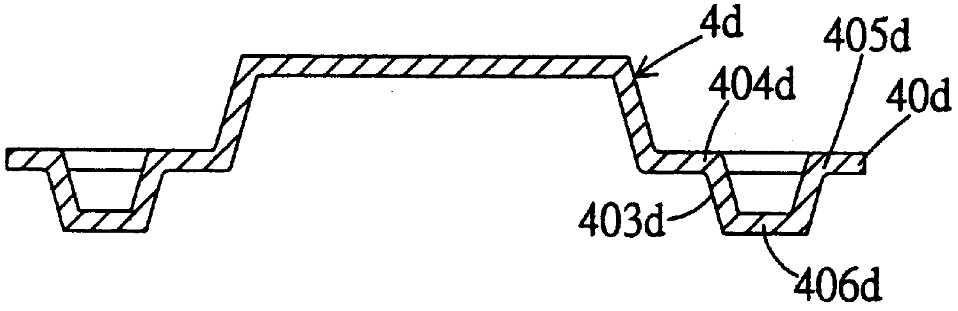
FIG. 8 is a sectional view which illustrates a heat spreader of a semiconductor package in accordance with the fifth embodiment of the present invention.

Now referring to FIG. 8, the fifth embodiment of the present invention has the structure which is also similar to that of the first embodiment. However, a dented supporting part 403*d* is uniformly formed by punching the lower portion 40*d*, ends 404*d* and 405*d* of the dented supporting part 403*d* connect with the lower portion 40*d*, a U-shaped supporting part 406*d* sits on the first surface 20 of the substrates 2 for keeping a distance between the heat spreader 4*d* and the substrate 2.

Figure 9:
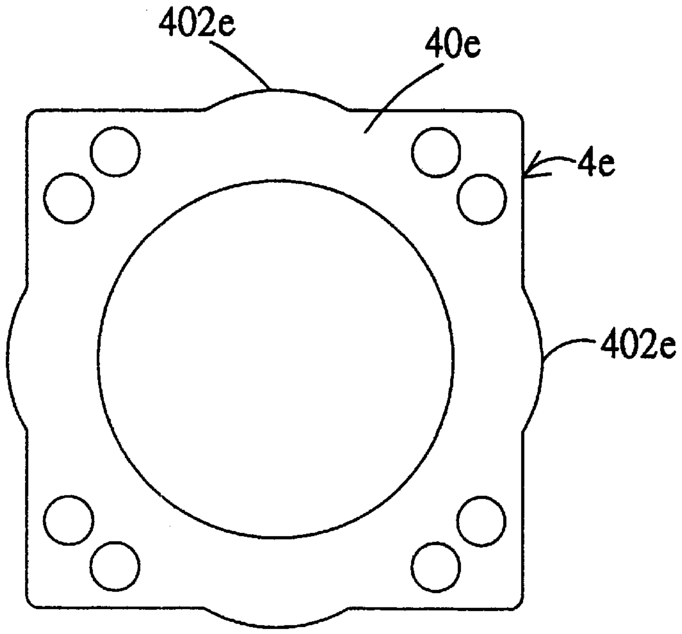
FIG. 9 is a sectional view which illustrates a heat spreader of a semiconductor package in accordance with the sixth embodiment of the present invention.
Figure 10:
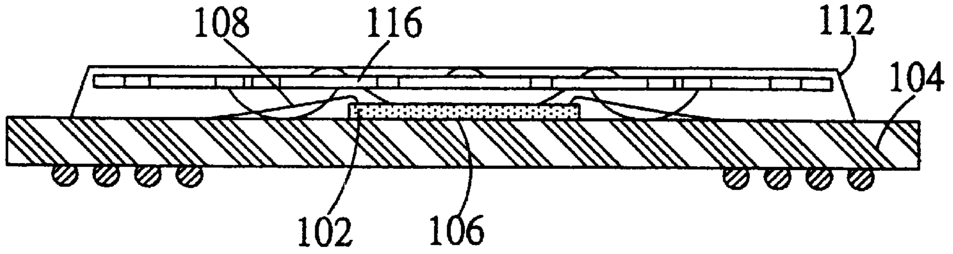
FIG. 10 is an overlooked view which illustrates a semiconductor package in accordance with the U.S. Pat. No. 5,736,785.
Figure 11:
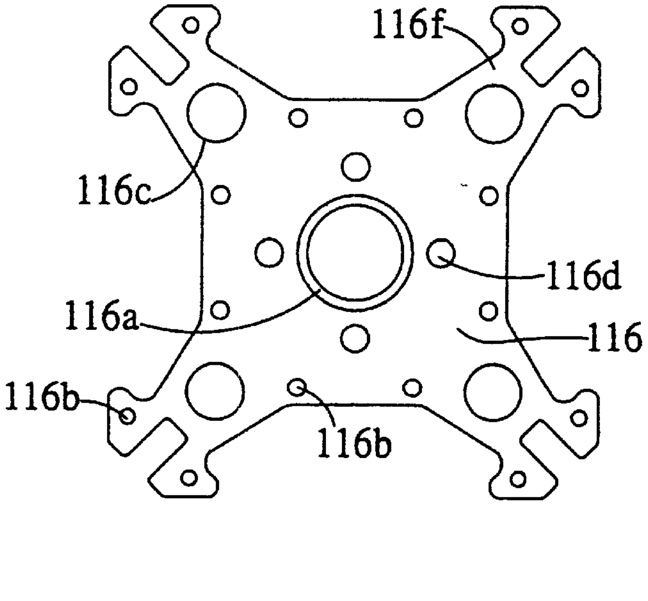
FIG. 11 is an overlooked view which illustrates a heat spreader of a semiconductor package in accordance with the U.S. Pat. No. 5,736,785.

Referring to FIG. 9, the sixth embodiment of the present invention has the structure which is also similar to that of the first embodiment. However, in the heat spreader 4*e* of the sixth embodiment, the positioning members 402*e* contacting with side walls of upper half mold or lower half mold outwardly extend from central region of four sides of the lower portion 40*e*. The positioning members 402*e*, shown in FIG. 9, can be arc-shaped, corn-shaped, or without any limitation in shapes.

The present invention has been described hitherto with exemplary preferred embodiments. However, it is to be understood that the scope of the present invention need not be limited to the disclosed preferred embodiments. On the contrary, it is intended to cover various modifications and similar arrangements with the scope defined in the following appended claims. The scope of the claims should be accorded the broadest interpretation so as to encompass all such modifications and similar arrangements.

What is claimed is:

1. A semiconductor package, comprising:

a substrate having a first surface and a second surface;

first conductive traces formed on the first surface of the substrate;

second conductive traces formed on the second surface of the substrate and electrically connected with the first conductive traces via a plurality of vias formed in the substrate;

a semiconductor chip mounted on the first surface of the substrate and electrically connected to the first conductive traces;

a plurality of solder balls attached to the second surface of the substrate for electrical connection with the second conductive traces;

a heat spreader disposed on the first surface of the substrate, the heat spreader comprising an upper portion, a lower portion formed with an opening in the center for receiving the semiconductor chip, and a connecting portion for connecting the lower portion and the upper portion in a manner that the upper portion is raised to a height above the opening of the lower portion, wherein the lower portion is formed with a plurality of positioning members outwardly extending from edges of the lower portion for preventing the heat spreader on the substrate from being dislocated during a molding process, and further including downward flutes formed on the periphery of the opening for enabling resin to flow underneath the heat spreader; and a plurality of supporting members to support the heat spreader over the substrate to allow a top surface of the upper portion to be exposed to the exterior of an encapsulant subsequently formed to encapsulate the semiconductor chip and a portion of the heat spreader, and to keep the semiconductor chip from being in contact with the heat spreader.

2. The semiconductor package of claim 1, wherein the positioning members of the lower portion extend horizontally along a plane where the lower portion lines.

3. The semiconductor package of claim 1, wherein the supporting members are formed on the lower portion of the heat spreader by punching recesses.

4. The semiconductor package of claim 1, wherein the supporting members are protrudent tongues formed on the lower portion of the heat spreader by shearing.

5. The semiconductor package of claim 1, wherein a plurality of holes are formed in the lower portion of the heat spreader.

6. The semiconductor package of claim 1, wherein the upper portion of the heat spreader is plane-shaped.

7. The semiconductor package of claim 1, wherein the upper portion of the heat spreader is wave-shaped.

8. The semiconductor package of claim 1, wherein the upper portion of the heat spreader is rectangular-wave-shaped.

9. The semiconductor package of claim 1, wherein a plurality of vias are formed in the substrate for electrically connecting the first conductive traces with the second conductive traces.

10. The semiconductor package of claim 1, wherein a plurality of solder pads are joined to terminal ends of the second conductive traces for the solder balls to be attached thereto.

11. The semiconductor package of claim 1, wherein the semiconductor chip is adhered to the substrate by adhering paste.

12. A semiconductor package, comprising:

a substrate having a first surface and a second surface;

first conductive traces formed on the first surface of the substrate;

second conductive traces formed on the second surface of the substrate and electrically connected with the first conductive traces via a plurality of vias formed in the substrate;

a semiconductor chip mounted on the first surface of the substrate and electrically connected to the first conductive traces;

a plurality of solder balls attached to the second surface of the substrate for electrical connection with the second conductive traces;

a heat spreader disposed on the first surface of the substrate, the heat spreader comprising an upper portion, a lower portion formed with an opening in the center for receiving the semiconductor chip, and a connecting portion for connecting the lower portion and the upper portion in a manner that the upper portion is raised to a height above the opening of the lower portion, the height of the heat spreader being greater than a cavity of an encapsulating mold, wherein the lower portion is formed with a plurality of positioning members outwardly extending from edges of the lower portion for preventing the heat spreader on the substrate from being dislocated during a molding process, and further including downward flutes formed on the periphery of the opening for enabling resin to flow underneath the heat spreader; and a plurality of supporting members to support the heat spreader over the substrate to allow a top surface of the upper portion to be exposed to the exterior of an encapsulant subsequently formed to encapsulate the semiconductor chip and a portion of the heat spreader, and to keep the semiconductor chip from being in contact with the heat spreader.

13. The semiconductor package of claim 12 wherein the height of the heat spreaders is greater than that of a cavity of an encapsulating mold by an amount not exceeding 0.2 mm.

14. The semiconductor package of claim 12 wherein the height of the heat spreader is greater than that of a cavity of an encapsulating mold by an amount not exceeding 0.1 mm.

* * * * *

UNITED STATES PATENT AND TRADEMARK OFFICE

CERTIFICATE OF CORRECTION

PATENT NO. : 6,552,428 B1
APPLICATION NO. : 09/416314
DATED : April 22, 2003
INVENTOR(S) : Huang et al.

It is certified that error appears in the above-identified patent and that said Letters Patent is hereby corrected as shown below:

On the cover of the patent, in column 1, after the line that reads (22) Filed: Oct. 12, 1999, please add:

--(30) Foreign Application Priority Data

Oct. 12, 1998 (TW) ..........................87116851--.

Signed and Sealed this

Fourteenth Day of November, 2006

JON W. DUDAS
*Director of the United States Patent and Trademark Office*